AUTOMATIC CONTROL OF DRIVE FOR LINEAR POWER AMPLIFIER

Filed Dec. 30, 1965

INVENTORS
GEORGE H. KAM
MICHAEL D. RUBIN
BY
Stanley M. Schwarz
ATTORNEY

INVENTORS
GEORGE H. KAM
MICHAEL D. RUBIN
BY
Stanley M. Schwarz
ATTORNEY 3,428,909

AUTOMATIC CONTROL OF DRIVE FOR LINEAR POWER AMPLIFIER

George H. Kam, Tonawanda, and Michael Rubin, Cheektowaga, N.Y., assignors to Sylvania Electric Products Inc., a corporation of Delaware Filed Dec. 30, 1965, Ser. No. 517,584
U.S. Cl. 330—15 11 Claims
Int. Cl. H03g *3/30;* H04b *1/04;* H03f *3/26*

ABSTRACT OF THE DISCLOSURE

An automatic driver power control circuit including a set of detectors for respectively sensing output voltage and current threshold exceedences of a power amplifier and a control amplifier for combining these sensings to provide a single control signal for regulating the drive level applied to the power amplifier.

This invention relates generally to amplifier circuits, and more particularly to an automatic load control gain control circuit for regulating the drive power to a broad band power amplifier to maintain linear operation and provide overdrive protection regardless of varying load impedances. The invention is especially intended for use with transistorized amplifiers.

The gain and linear operation of an amplifier circuit is affected by a number of parameters including the frequency of operation, input signal modulation, drive power, and load. Variations in any one or more of these parameters, unless compensated, can have adverse effects on circuit operation. In the case of transistor amplifiers, load variations can lead not only to clipping, distortion and, in general, no-linear operation, but for the case of excessively heavy or short circuit loads, transistor burnout can result. Such load variations may be attributable to any one of a number of sources. For instance, in the case of a radio transmitter, a large range of power amplifier load variations may be created by the necessity of changing antennas to adequately cover the channel or carrier frequency range of the transmitter. As an illustration, in one of the transmitter designs in which the present invention is employed, six different antennas are required to cover the range of operation from 4 thru 20 mc./sec.

A technique called "automatic load control" has been employed in vacuum tube circuits to reduce distortion due to overdrive by detecting the voltage on the grid of the power amplifier tube and using it to control the gain of the pre-amplifier. This approach, however, does not adequately attack the problem of varying load impedances nor does it compensate for a number of other sources of non-linear operation and adverse gain variation.

Accordingly, it is a general object of this invention to provide means for automatically controlling the drive power applied to a power amplifier to thereby maintain linear operation.

It is a more particular object of the invention to provide efficient automatic load control and automatic gain control for regulating the drive power to a broadband transistorized power amplifier while preserving linear operation under load variations from no load to short circuit and also protecting the transistors from burnout.

Another object is to provide an automatic load control/gain control circuit for maintaining the output power of a power amplifier at a desired level over a relatively wide range of operating frequencies.

Briefly, these objects are attained by sensing both output voltage and current threshold exceedences of a power amplifier and combining these sensings to provide a single control signal for regulating the level of drive power applied to the amplifier. More specifically, as applied to a transistor power amplifier, a peak collector voltage detector and peak emitter current detector are employed to sense the amount by which the peak collector voltage exceeds a selected threshold level and the amount by which the peak emitter current exceeds a selected threshold level, respectively. These sensings are combined in an automatic load control/gain control (ALC/AGC) amplifier which comprises a single direct current (DC) transistor amplifier. The voltage level sensing is connected to the base electrode of the DC amplifier, and the current level sensing is connected to the emitter circuit of the DC amplifier, the respective threshold levels being established by the peak detector components and the DC amplifier base bias and emitter circuit voltage drops, respectively. The ALC/AGC direct current amplifier is normally conducting, and its collector voltage is applied as an AGC signal to control the gain of a pre-amplifier stage in the drive power source for the power amplifier. In this circuit arrangement, the ALC/AGC amplifier is operative to reduce the gain of the pre-amplifier, and hence the drive power level, as the sensings separately or in combination increase in magnitude.

The invention provides automatic load control in the following manner. If the load is excessively heavy or short circuited, the peak emitter current tends to increase. The ALC circuit counteracts this tendency by reducing drive power, to thereby prevent transistor burnout. If the load is light or there is a no load condition, the peak collector voltage tends to increase. In this event, the ALC circuit, by reducing drive power, prevents clipping to thereby maintain linear operation. The power amplifier is normally overdriven in the absence of a control signal, thus the ALC/AGC circuit provides continuous dynamic control. As an additional feature, the invention also contemplates the provision of an AGC voltage having a fast attack and slow decay time so that the AGC action will not destroy modulation information.

In a second embodiment of the invention, an average collector current detector, instead of a peak emitter current detector, is used to provide current level sensing, this embodiment being of particular advantage in relatively high power high frequency applications.

Other objects, features, and advantages of the invention, and a better understanding of its operation, will become apparent from the following description, reference being had to the accompanying drawings, in which.

Figure 1:
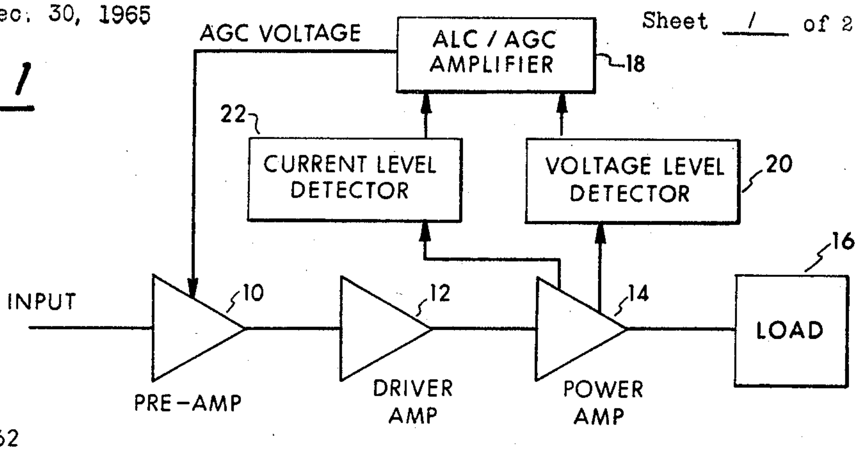
FIG. 1 is a block diagram of the automatic drive power control means of the invention in combination with a power amplifier and drive source.

Referring to FIG. 1, a block diagram of the invention is shown in combination with a typical cascade-connected amplifier string comprising a pre-amplifier 10, a drive amplifier 12, and a power amplifier 14. A modulated or unmodulated input signal is applied to pre-amplifier 10, and the output of power amplifier 14 is connected to a load 16. Such amplifier strings are employed in a variety of applications; for example: transmitters—in which case the input would be derived from a modulator, and the load would be an antenna; receivers—in which case the input would be from a detector, and the load would be a speaker coil; and high fidelity play-back units—in which case a phono or tape pick-up would provide the input.

Pre-amplifier 10 is adapted to be controlled in gain by an applied DC voltage (AGC signal), thereby enabling control of the drive power level applied to the power amplifier 14. Such gain controllable amplifiers are well known, especially the type employing control of base or grid bias, a preferred amplifier adapted for AGC being described in copending patent applications Ser. No. 460,872 filed June 2, 1965 and assigned to the assignee of the present invention. In accordance with the present invention, the AGC voltage for the pre-amplifier is derived from an ALC/AGC amplifier 18 which combines sensing signals from an output voltage level detector 20 and a current level detector 22, both connected to the power amplifier, in order to provide overdrive protection irrespective of load variations, while maintaining linear operation. The voltage level detector generates a sensing signal corresponding in magnitude to the amount by which the output voltage level of the power amplifier exceeds a selected threshold level, and the current level detector generates a sensing signal corresponding in magnitude to the amount by which the current level of the power amplifier exceeds a selected threshold level. The ALC/AGC amplifier and gain controllable pre-amplifier stage are designed to vary the output power level of the drive power source (the output of driver 12) inversely proportional to the magnitude of these sensings, thereby automatically regulating the drive power to the power amplifier in response to the sensings.

Figure 2:
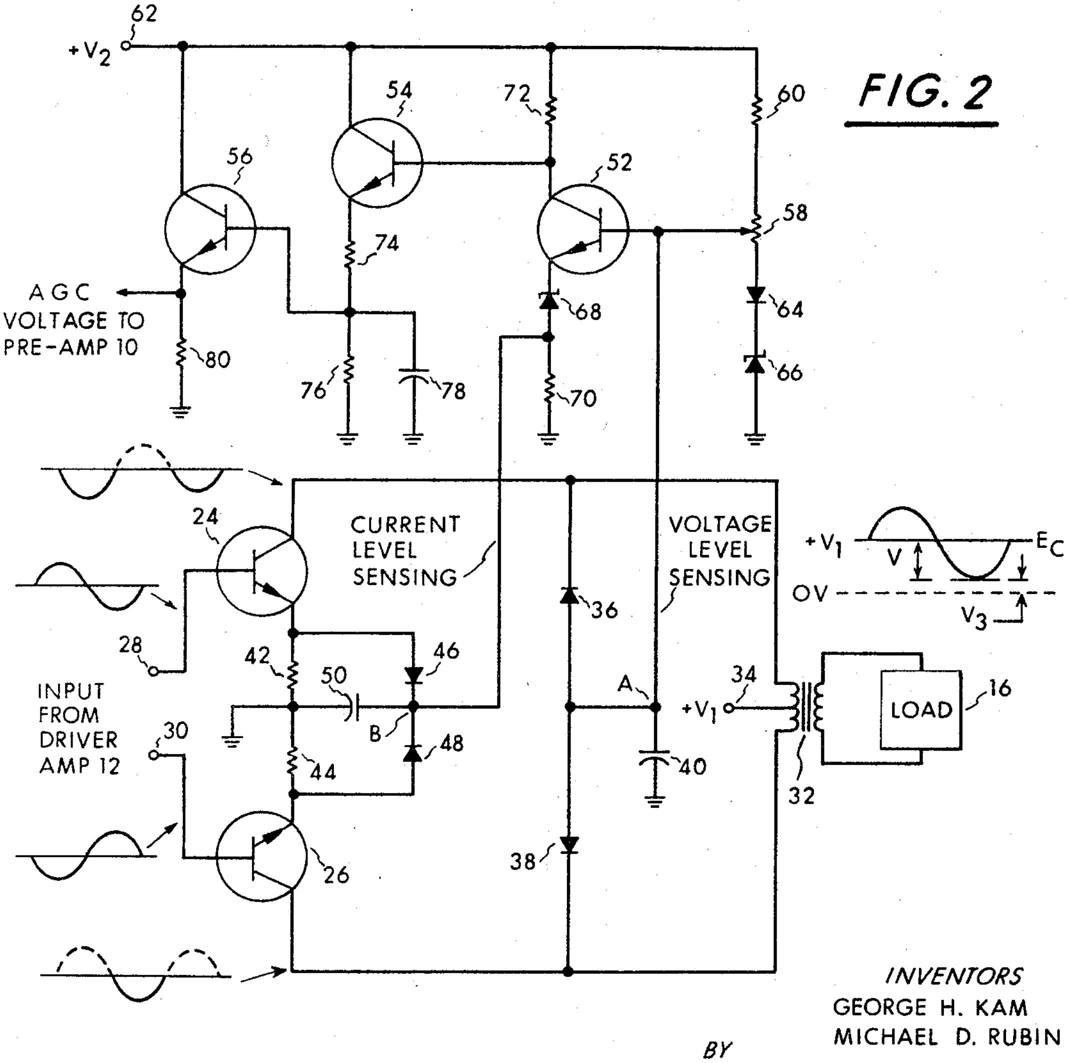
FIG. 2 is a schematic diagram of a transistorized circuit embodiment of the automatic drive power control means of the invention in combination with a transistorized push-pull power amplifier.

Referring now to FIG. 2, a transistorized embodiment of the invention is shown employing peak detectors in combination with a push-pull power amplifier comprising transistor 24 and 26. The drive power input to the push-pull circuit is coupled from amplifier 12 via input terminals 28 and 30 to the base electrodes of transistors 24 and 26, respectively. The collectors of transistors 24 and 26 are coupled via transformer 32 to load 16. A source of positive DC voltage ($+V_1$) represented by terminal 34 is connected via the primary winding center tap of transformer 32 to provide the collector supply voltage for the push-pull transistors. The voltage level detector in this instance is a peak collector voltage detector comprising a pair of oppositely poled diodes 36 and 38 serially connected across the collector electrodes of the push-pull transistors. An AC by-pass capacitor 40 is connected from the junction of diodes 36, 38 to ground. These diodes are selected to be electrically symmetric and arranged with the anodes connected together and the cathodes connected to the respective power amplifier collector output terminals. As will be described hereinafter, the voltage level sensing is available at the circuit junction of diodes 36 and 38 and capacitor 40, which for convenience is denoted as junction A. The current level detector is a peak emitter current detector and comprises current sensing resistors 42 and 44 respectively connected between the emitter electrodes of transistors 24, 26 and ground, a pair of oppositely poled diodes 46 and 48 serially connected across the emitter electrodes of these push-pull transistors, and an AC by-pass capacitor 50 connected together and the anodes ocnnected to the reground. Diodes 46 and 48 are also selected to be electrically symmetric but are arranged with the cathodes connected together and the anodes connected to the respective power amplifier collector output terminals. The current level sensing is available at the circuit junction of diodes 46 and 48 and capacitor 50, which for convenience is denoted as junction B.

The ALC/AGC amplifier comprises a transistor 52, connected as a DC amplifier, and transistors 54 and 56, each connected as emitter follower amplifiers. The base of transistor 52 is connected to a temperature stabilized source of positive DC bias voltage, which in this instance comprises the tap on a variable resistor 58, one end terminal of which is connected through a resistor 60 to a source of positive DC voltage ($+V_2$), represented by terminal 62, and the other end terminal of which is connected through serially connected diode 64 and Zener diode 66 to ground. More specifically, the cathodes of diodes 64 and 66 are connected together and the anode of the Zener diode 66 is connected to ground. The emitter of transistor 52 is connected through serially connected Zener diode 68 and resistor 70 to ground, the cathode of diode 68 being connected to the emitter, and the collector of transistor 52 is connected through resistor 72 to the voltage $+V_2$ at terminal 62, thereby providing a source of collector supply voltage. DC amplifier 52 provides the means for combining the voltage and current level sensings and therefore has two inputs. The voltage level sensing path is connected from junction A of the peak voltage level detector to the base of transistor 52, and the current level sensing path is connected from junction B of the peak current level detector to the emitter circuit of transistor 52 at the junction of the anode of diode 68 and resistor 70.

The serially connected circuit comprising resistor 60, variable resistor 58, diode 64 and Zener diode 66 not only provides a temperature stabilized base bias source for the DC amplifier (transistor 52), but more particularly, it is designed to establish a desired bias voltage level at the anodes of the voltage detector diodes 36 and 38; this bias voltage level and the forward voltage drop of diode 36 determines the transistor 24 peak collector voltage threshold level, and this bias voltage together with the forward voltage drop of diode 38 determines the transistor 26 peak collector voltage threshold level. Diode 64 is selected to compensate for temperature variations of the base-emitter junction of transistor 52, and Zener diode 66 is selected to establish a desired reference voltage above ground. Resistor 70 in the emitter circuit of the DC amplifier establishes a desired reverse bias voltage level at the cathodes of the current detector diodes 46 and 48, this reverse bias together with the forward voltage drop of diode 46 and the resistance value of current sensing resistor 42 determining the transistor 24 peak emitter current threshold level, and this reverse bias, the forward voltage drop of diode 48 and the resistance value of current sensing resistor 44 determining the transistor 26 peak emitter current threshold level. Zener diode 68, then, establishes the desired emitter voltage for the DC amplifier and variable resistor 58 enables adjustment to the desired fixed DC quiescent current level for amplifier transistor 52, which is normally conducting.

The collector of transistor 52 is DC connected to the base of emitter follower transistor 54, the collector of which is connected to supply voltage terminal 62, and the emitter electrode of which is connected via serially connected resistors 74 and 76 to ground. The junction of resistors 74, 76 is AC bypassed to ground via capacitor 78. As will be described hereinafter, the circuit comprising resistors 74 and 76 and capacitor 78 functions as a fast attack slow decay network for improving the AGC circuit action. The output of this network, at the junction of resistors 74, 76 is connected to the base of emitter follower transistor 56; the collector of this emitter follower is connected to the supply voltage source at terminal 62, and the emitter is connected to ground via resistor 80. The AGC voltage is derived at the emitter of transistor 56 and applied to preamplifier 10 for regulating the drive source.

Emitter follower 54 functions to provide a low source impedance for the RC network connected in its emitter circuit, while emitter follower 56 provides a high load impedance to this RC network and a low AGC source impedance. Thus, the emitter followers "isolate" DC amplifier 52 and pre-amplifier 10 from the RC network in the emitter circuit of transistor 54.

For purposes of illustration, the following is a list of some of the more significant circuit values employed in a typical application of the FIG. 2 circuit embodiment of the invention:

| | | |
|---|---|---|
| Resistors 42, 44 | ohms | 0.9 |
| Resistors 58 | do | 500 |
| Resistors 60, 72 | do | 3.9K |
| Resistors 70, 74 | do | 300 |
| Resistors 76 | do | 150K |
| Resistors 80 | do | 100K |
| Capacitor 78 | μf | 100 |
| $+V_1$ | volts | 24 |
| $+V_2$ | do | 12 |
| Voltage drop across Zener diode 66 | do | 3.4 |
| Forward voltage drop of each of diodes 36, 38, 46, 48, 64 | do | 0.7 |
| Quiescent bias at base of transistor 52 | do | +4.2 |
| Voltage threshold level ($V_3$) | | |
| Quiescent voltage drop across resistor 70 | do | 0.5 |
| Current threshold level | amps | [2]1.3 |
| Voltage drop across Zener diode 68 | volts | 3.0 |
| Quiescent voltage at emitter of transistor 52 | do | +3.5 |
| Quiescent voltage at collector of transistor 52 | do | +4.5 |

[1] +3.5 volts from 0 v. ref. (or a peak to peak voltage swing of ±20.5 volts about the $+V_1$ reference of 24 volts).
[2] (Or 1.2 volts across resistor 42.)

The operation of the circuit shown in FIG. 2 will now be described, using the above listed illustrative circuit values to enable a clearer understanding. It has been initially determined that reliable linear operation of this particular power amplifier could be maintained if the peak to peak collector voltage did not exceed ±20.5 volts about the $+V_1$ reference, and if the peak emitter current did not exceed 1.3 amperes. Consequently, the voltage and current threshold levels of the ALC/AGC sensing circuits were selected accordingly. In class B push-pull operation, transistors 24 and 26 conduct on alternate half cycles, as illustrated by the waveforms associated with the collector outputs. As a result, during the half cycle that transistor 24 conducts, the active detector circuit components are diodes 36 and 46 and resistor 42, while diodes 38 and 48 and resistor 44 essentially play no part in the operation; of course, the reverse holds true during the half cycle that transistor 26 conducts. In discussing detector circuit operation, therefore, only the components actuated by transistor 24 will be referred to, it being clearly understood that the operation is identical for the symmetrically opposite half of the power amplifier and detectors during the alternate half cycle.

If the power amplifier is operated without exceeding the above-mentioned peak collector voltage and peak emitter current threshold levels, the ALC/AGC amplifier operates in a quiescent condition to provide a minimum AGC voltage level, thereby allowing the pre-amplifier stage 10 to operate with maximum gain. In this quiescent condition, DC amplifier transistor 52 has +4.2 volts base bias, as selected by adjustment of variable resistor 58, and +3.5 volts at its emitter, as established by the voltage drop across the serially connected Zener diode 68 and resistor 70. Consequently, transistor 52 is forward biased and conducting, with +4.5 volts appearing at its collector electrode. Now the +4.2 volts bias at the base of transistor 52 is also connected via the voltage sensing path to the anode of diode 36 (and diode 38). Consequently, allowing for the 0.7 volt diode forward voltage drop, diode 36 will remain reverse-biased until the instantaneous voltage at its cathode drops below +3.5 volts. The voltage at the cathode of diode 36 is the voltage swing across the primary of transformer 32, which also appears at the collector of transistor 24 (and transistor 26). As illustrated by the waveform associated with the primary of transformer 32, this output voltage swings about the $+V_1$ supply voltage level of 24 volts. Diode 36 and its anode bias establish the peak voltage threshold level $V_3=+3.5$ volts. Thus diode 36 (and diode 38) will not conduct unless the output voltage swing exceeds +20.5 volts about $+V_1$.

The +0.5 volt at the junction of resistor 70 and diode 68 is connected to the cathode of diode 46 (and diode 48) via the current sensing path, and thus acts as a reverse bias voltage for diode 46. This reverse bias together with the 0.7 volt forward voltage drop of diode 46 renders diode 46 non-conducting unless the instantaneous voltage across resistor 42 exceeds 1.2 volts. Current sensing resistor 42 is selected to provide an instantaneous IR drop of 1.2 volts for a peak emitter current of 1.3 amperes, the current threshold level.

If the load becomes excessively heavy or is actually shorted, the peak emitter current tends to increase, causing the voltage drop across resistor 42 to exceed 1.2 volts. At this point, diode 46 starts to conduct, thereby increasing the voltage at point B and, via the current level sensing path, increasing the voltage at the junction of diode 68 and resistor 70 above the quiescent value of +0.5 volts. This circuit action results in an increase in the emitter voltage of transistor 52, thereby reducing the forward bias of the amplifier. As a result, the voltage on the collector of transistor 52 arises from 4.5 volts toward the collector supply level of $+V_2=12$ volts. The increased collector voltage of DC amplifier 52 biases emitter follower 54 to conduct more heavily, which in turn causes emitter follower 56 to conduct heavier, thereby increasing the voltage drop across resistor 80. The rising positive AGC voltage level at the emitter of transistor 56 is then applied to reduce the gain of pre-amplifier stage 10 and thereby reduce the drive furnished to driver amplifier 12. In this manner, the drive to the final power amplifier is reduced until the peak emitter current decreases to the threshold level of 1.3 amperes.

If the short across the load circuit is removed, the emitter current will tend to decrease, thereby reducing the voltage at point B and at the emitter of transistor 52 to cause an increase in the forward bias of the DC amplifier and a decay in the AGC signal. This reverse action increases the gain of the pre-amplifier to thereby increase the drive level to the power amplifier. This reverse AGC action can also be useful in compensating for the gain variations of frequency sensitive transistor amplifiers. The peak limit control allows a design whereby the power amplifier is normally "overdriven" to assure maximum output levels, i.e., operation is such that the detector diodes are normally conducting. In such case, a reverse AGC action will also occur if the gain of the power amplifier stage should drop due to a change in operating frequency. That is, the drop in gain would reduce the power amplifier peak emitter current, causing the AGC to decay and the drive power to be increased, thereby maintaining power output over a wide frequency operating range, e.g., 4 thru 20 mc./sec.

Now, if the load across transformer 32 is removed or becomes unusually light, the voltage swing across the primary of transformer 32 will be caused to exceed +20.5 volts. Consequently, the instantaneous voltage between the cathode of diode 36 and ground drops below +3.5 volts, causing diode 36 to conduct and thereby reduce the voltage at point A. Via the voltage sensing path, conducting diode 36 (and diode 38) causes the base bias of transistor 52 to drop from +4.2 volts toward +3.5 volts, thereby moving transistor 52 toward cut-off and causing its collector voltage to rise. As a result, emitter follower 54 and 56 start to conduct heavier, causing the voltage across resistor 80 to swing more positive. As discussed above, this leads to a reduction in gain of preamplifier 10, thus reducing the drive to the final power amplifier and thereby reducing the voltage swing at the collectors of transistors 24 and 26. In this manner clipping and distortion are prevented, and linear operation of the amplifier is maintained. When the load is connected once more, a reverse action takes place and the drive is increased to maintain output power with the increased load condition.

The voltage detector and ACL/AGC amplifier act in like manner to avoid distortion due to output voltage excursion variations resulting from information modulation being impressed on the input signal. If a maximum power output design is employed whereby the detector diodes are normally conducting to control the peak limits, virtually continuous dynamic control of drive power is provided to maintain linear operation. In this respect, it is desirable to have a fast attack of the AGC signal so as to avoid damage or clipping and distortion; however, if the AGC signal decays instantaneously, the information modulation would be destroyed. To handle this situation, the RC network in the emitter circuit of transistor 54 provides for a fast attack and slow decay of the AGC signal. The resistors 74 and 76 are selected and arranged such that capacitor 78 (100$\mu$f.) charges rapidly through resistor 74 (300 ohms) but discharges much slower through resistor 76 (150,000 ohms). In this instance the rate of decay is approximately 10 db/sec. sufficient to maintain output without adversely effecting modulation.

Figure 3:
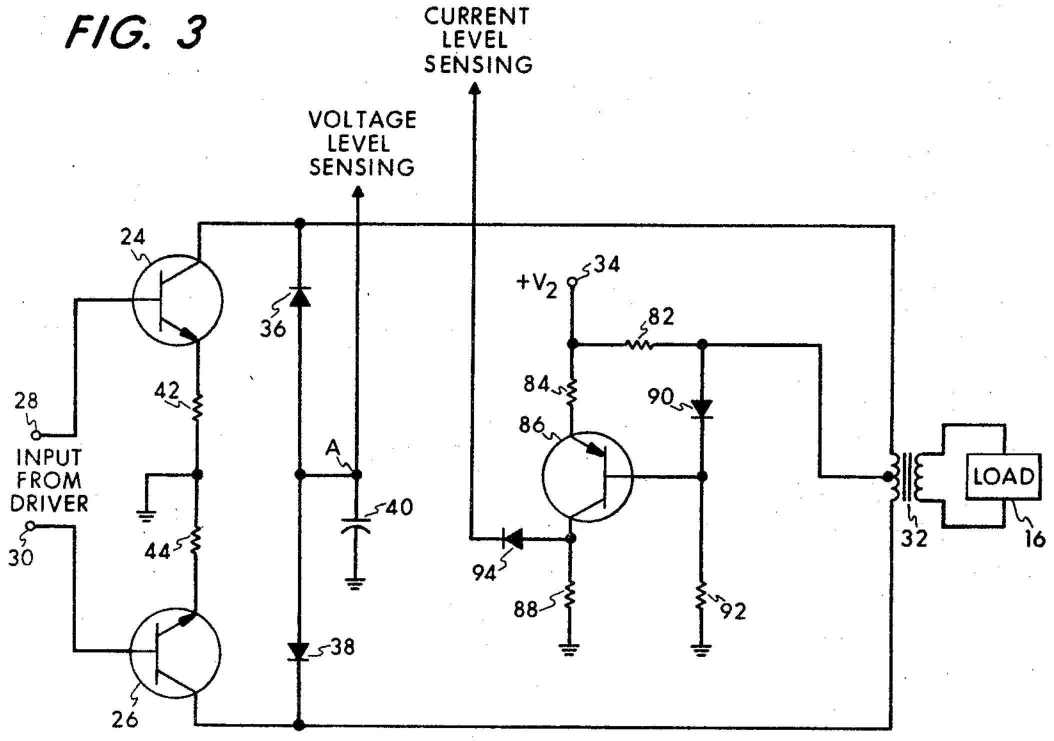
FIG. 3 is a schematic diagram illustrating a variation of a portion of the circuit of FIG. 2 relative to the means for providing current level sensing.

In some applications it may prove more advantageous to sense average collector current rather than peak emitter current to provide current overdrive protection. For example, at higher power, higher frequency operation it may not be desirable to degenerate the emitter with a current sensing resistor. A variation of the FIG. 2 circuit to provide a unique average collector current detector in lieu of the peak emitter current detector is illustrated in FIG. 3, components similar to those of FIG. 2 being numbered the same. In FIG. 3, if design permits, emitter resistors 42 and 44 may be eliminated and the emitters of transistors 24 and 26 connected directly to ground. The voltage and current level sensing paths may be connected to transistor 52 as shown in FIG. 2 or, as will be described further on, the current sensing path may be connected directly to the emitter of transistor 52.

The average collector current detector shown in FIG. 3 comprises a current sensing resistor 82 connected from the supply voltage source $+V_2$, represented by terminal 34, to the collectors of transistors 24 and 26, via the primary winding of transformer 32, and a DC voltage amplifier comprising PNP transistor 86. The emitter of transistor 86 is connected via resistor 84 to $+V_2$, the base is connected via diode 90 to the junction of resistor 82 and the center tap of the output transformer primary winding, and the collector is connected through resistor 88 to ground. Diode 90 compensates for base-emitter voltage variations in transistor 86 due to temperature, the cathode of diode 90 being connected to the base electrode of the transistor. A bias resistor 92 is connected between the base of transistor 86 and ground, and the collector of the PNP transistor is connected via diode 94 to the emitter circuit of transistor 52. The anode of diode 94 is connected to the collector of transistor 86, and the cathode of diode 94 may be considered the detector output terminal from which the current sensing path is connected to the ALC/AGC amplifier.

In a typical application of this average collector current detector the following circuit values were employed and the cathode of diode 94 was connected to the emitter of transistor 52 (FIG. 2), which in the quiescent state was at +3.5 volts:

| | | |
|---|---|---|
| $+V_2$ | volts | +24 |
| Resistor **82** | ohm | 0.1 |
| Resistor **84** | do | 100 |
| Resistor **88** | do | 1000 |
| Forward voltage drop of diode **94** | volts | 0.7 |

In operation, the current sensing circuit of FIG. 3 measures the DC collector current flowing from the $+V_2$ source at terminal 34 to the power amplifier collector electrodes, converts this value to a proportional voltage level at the anode of diode 94, and causes diode 94 to conduct when the threshold level established by the reverse bias applied to the diode and its forward voltage drop is exceeded. Actually the current threshold level is determined by the resistance values of resistors 82, 84 and 88, the gain of transistors 86, the forward voltage drop of diode 94 and the voltage drop across Zener diode 68 and resistor 70 in FIG. 2. The PNP transistor is operated as a DC amplifier, with its gain being primarily determined by resistors 84 and 88. Using the above listed circuit parameters for illustration, the threshold voltage established at the anode of diode 94 is 4.2 volts (0.7 volt forward voltage drop of the diode plus +3.5 volts reverse bias at the emitter of transistor 52). This storage threshold of 4.2 volts establishes a 4.2 amps DC collector current threshold as will now be explained.

A 4.2 amps DC current flow through the 0.1 ohm sensing resistor 82 results in a 0.42 volt drop across that resistor. Due to the operation of the PNP amplifier, this 0.42 volt drop also appears across the 100 ohm resistor 84. Consequently, a 4.2 ma. current flows through both resistor 84 and the 1000 ohm resistor 88. The IR drop across resistor 88, therefore, is 4.2 volts. Thus, a DC collector current in excess of 4.2 amps increases the voltage at the anode of diode 94 above 4.2 volts, thereby causing it to conduct and decrease the forward-bias of transistor 52. The ALC/AGC amplifier then operates as previously described to control drive power in response to the current level sensing.

In summary, an automatic drive power control means has been provided comprising: a voltage detector operative to generate a DC sensing signal at junction point A which corresponds in negative-going magnitude to the amount by which the peak collector voltage of the power amplifier exceeds, in negative swing, the established threshold level; a peak emitter (or average collector) current detector operative to generate at junction point B (or the cathode of diode 94) a DC sensing signal which corresponds in positive-going magnitude to the amount by which the peak emitter current (or average collector current) exceeds, in the positive-going sense, the established threshold level; and, a DC amplifier for combining these voltage and current sensings to provide a single DC control signal to control the gain of the pre-amplifier, thereby varying the drive power to the final amplifier inversely proportional to the magnitude of the sensings. In this manner, the drive power to the final power amplifier is controlled when limiting values of peak current (or average current) and peak voltage are exceeded, resulting in the preservation of linear operation regardless of varying load impedances and drive levels, protection against possible transistor burnout from overdrive, and maintenance of power output over the operating frequency range.

While the invention has been described as embodied in transistorized circuits, the advantages thereof are also obtainable when vacuum tubes are used as the active elements. A vacuum tube embodiment of FIG. 2 would be represented by a similar circuit schematic, with vacuum tubes substituted for transistors, anode connections for collector connections, cathode for emitter connections, and grid for base connections. The circuit values would of course be modified to be compatible with the characteristics of vacuum tubes. It will also be understood that the ALC/AGC amplifier technique is equally suitable for use with other power amplifier configuration than the push-pull type shown. If a single-ended power amplifier is employed, the FIG. 2 detectors would comprise only diodes 36 and 46 and resistor 42. Further, the invention is applicable to narrow band amplifiers as well as the broadband type.

What is claimed is:

1. In combination with a first amplifier connected between a source of drive power and an output load, means for automatically controlling the amount of drive power applied to said first amplifier comprising, means for sensing output voltage levels of said first amplifier which exceed a selected threshold, means for sensing current levels of said first amplifier which exceed a selected threshold, means for regulating the power output level of said drive power source in response to a control signal applied thereto, and means for combining said voltage and current level sensings to provide a single control signal to said drive power regulating means, said last mentioned means and said regulating means being operative to vary the output power level of said drive power source inversely proportional to the magnitude of said sensings.

2. Automatic drive power control means in accordance with claim 1 wherein said means for combining said voltage and current level sensings comprises a second amplifier including a transistor having collector, emitter and base electrodes, means for applying said voltage level sensing to the base electrode of said transistor, means for applying said current level sensing to the emitter electrode of said transistor, and means connecting the collector of said transistor to said drive power regulating means, said second amplifier being operative in response to said voltage and current level sensings to provide at its collector a control signal for said drive power regulating means.

3. Automatic drive power control means in accordance with claim 2 wherein said means connecting the collector of said second amplifier transistor to said drive power regulating means comprises a third amplifier including a transistor having collector, emitter and base electrodes connected as an emitter follower, means connecting the collector of said second amplifier transistor to the base of said third amplifier transistor, means connecting the collector electrode of said third amplifier transistor to a source of direct current supply voltage, a source of reference potential, first and second resistors serially connected between the emitter of said third amplifier transistor and said source of reference potential, a capacitor connected between the junction of said first and second resistors and said source of reference potential, and means connecting the junction of said first and second resistors to said drive power regulating means; the values of said first and second resistors and said capacitor being selected so that said capacitor will charge rapidly through said first resistor but discharge substantially slower through said second resistor thereby providing for a fast attack and slow decay of said control signal.

4. Automatic drive power control means in accordance with claim 1 wherein said means for combining said voltage and current level sensings comprises a second amplifier having first and second input terminals and an output terminal, means connecting the first input terminal of said second amplifier to a source of direct current bias voltage, means connecting the second input terminal of said second amplifier to a source of reference potential, means including a first series resistor connecting the output terminal of said second amplifier to a first source of direct current supply voltage, means for applying said voltage level sensing to the first input terminal of said second amplifier, means for applying said current level sensing to the second input terminal of said second amplifier, and means connecting the output terminal of said second amplifier to said drive power regulating means, said second amplifier being operative in response to said first supply voltage, said bias voltage, and said voltage and current level sensings to provide at its output terminal a direct current control signal for said drive power regulating means.

5. Automatic drive power control means in accordance with claim 4 wherein said first amplifier has input, output and common terminals, said drive power source is connected to said input terminal, said common terminal is connected to said source of reference potential, said output terminal is connected to said load and a second source of direct current supply voltage, said voltage level sensing means comprises a voltage level detector connected between the output terminal of said first amplifier and said source of reference potential and operative to generate a sensing signal corresponding in magnitude to the amount by which the output voltage level of said first amplifier exceeds a selected voltage threshold level, and said current level sensing means comprises a current level detector connected in series with the output to common terminal circuit path of said first amplifier and operative to generate a sensing signal corresponding in magnitude to the amount by which the current level of said first amplifier exceeds a selected current threshold level.

6. Automatic drive power control means in accordance with claim 5 wherein said voltage level detector is a peak voltage detector comprising a first diode and a first capacitor serially connected in that order between the output terminal of said first amplifier and said source of reference potential, the sensing signal being available at the junction of said first diode and said first capacitor and said voltage threshold level being established by the forward voltage drop of said first diode and a bias voltage applied to said first diode, and said current level detector is a peak current detector comprising a second resistor connected between the common terminal of said first amplifier and said source of reference potential, and a second diode and second capacitor serially connected across said second resistor with the diode being connected to the end of the second resistor which is connected to the common terminal of said first amplifier, the sensing signal being available at the junction of said second diode and said second capacitor and said current threshold level being established by the resistance value of said second resistor, the forward voltage drop of said second diode and a bias voltage applied to said second diode.

7. Automatic drive power control means in accordance with claim 5 wherein said current level detector is an average current detector comprising a second resistor connected between said second source of supply voltage and the output terminal of said first amplifier, a third amplifier having first, second and third terminals, a third resistor connected between said first terminal and the junction of said supply voltage source and said second resistor, a first diode connected between the junction of said second resistor and said first amplifier output terminal and the second terminal of said third amplifier, a fourth resistor connected between said second terminal and said source of reference potential, a fifth resistor connected between said third terminal and said source of reference potential, a detector output terminal, and a second diode connected between said third terminal and said detector output terminal, the sensing signal being available at said detector output terminal and said current threshold level being established by the resistance values of said second, third and fifth resistors, the gain of said third amplifier, the forward voltage drop of said second diode and a bias voltage applied to said second diode.

8. Automatic drive power control means in accordance with claim 1 wherein said first amplifier includes a transistor having collector, emitter and base electrodes, said drive power source is connected to the base electrode of said first amplifier transistor, the collector of said first amplifier transistor is connected to said load and a first source of direct current supply voltage, said voltage level sensing means is a peak collector voltage detector comprising a first diode and first capacitor serially connected in that order between the collector of said first amplifier transistor and a source of reference potential and operative to generate a sensing signal at the junction of said first diode and first capacitor which corresponds in magnitude to the amount by which the peak collector voltage of said first amplifier transistor exceeds a selected voltage threshold level, said current level sensing means is a peak emitter current detector comprising a first resistor connected between the emitter of said first amplifier transistor and said source of reference potential, and a second diode and second capacitor serially connected across said first resistor with the diode being connected to the end of the first resistor which is connected to the emitter electrode, said current detector being operative to generate a sensing signal at the junction of said second diode and second capacitor which corresponds in magnitude to the amount by which the peak emitter current of said first amplifier transistor exceeds a selected current threshold level, said means for regulating the power output level of said drive power source including a second amplifier adapted to be controlled in gain by a direct current control voltage applied thereto, and said means for combining said voltage and current level sensings comprises a third amplifier including a transistor having collector, emitter and base electrodes, means connecting the base of said third amplifier transistor to a source of direct current bias voltage, impedance means and a second resistor serially connected in that order between the emitter of said third amplifier transistor and said source of reference potential, a third resistor connected between the collector of said third amplifier transistor and a second source of direct current supply voltage, a voltage sensing signal path connecting the junction of said first diode and first capacitor to the base of said third amplifier transistor, a current sensing signal path connecting the junction of said second diode and second capacitor to the junction of said impedance means and second resistor, and means including an automatic gain control signal path connecting the collector of said third amplifier transistor to said second amplifier, said voltage threshold level being established by the forward voltage drop of said first diode and said bias voltage, said current threshold level being established by the resistance value of said first resistor, the forward voltage drop of said second diode and the voltage drop across said second resistor, and said third amplifier being operative in response to said second supply voltage, said bias voltage, and said voltage and current sensing signals to provide at its collector electrode a direct current control voltage for said drive power regulating means.

9. Automatic drive power control means in accordance with claim 8 wherein said means connecting the collector of said third amplifier transistor to said second amplifier comprises a fourth amplifier including a transistor having collector, emitter, and base electrodes connected as an emitter follower, means connecting the collector of said third amplifier transistor to the base of said fourth amplifier transistor, means connecting the collector electrode of said fourth amplifier transistor to said second source of direct current supply voltage, fourth and fifth resistors serially connected between the emitter of said fourth amplifier transistor and said source of reference potential, a third capacitor connected between the junction of said fourth and fifth resistors and said source of reference potential, and an automatic gain control signal path connected from the junction of said fourth and fifth resistors to said second amplifier, the values of said fourth and fifth resistors and said third capacitor being selected so that said third capacitor will charge rapidly through said fourth resistor but discharge substantially slower through said fifth resistor thereby providing for a fast attack and slow decay of said direct current control voltage.

10. Automatic drive power control means in accordance with claim 1 wherein said first amplifier includes a transistor having collector, emitter and base electrodes, said drive power source is connected to the base electrode of said first amplifier transistor, the emitter of said first amplifier transistor is connected to a source of reference potential, the collector of said first amplifier transistor is connected to said load and a first source of direct current supply voltage, said voltage level sensing means is a peak collector voltage detector comprising a first diode and first capacitor serially connected in that order between the collector of said first amplified transistor and said source of reference potential and operative to generate a sensing signal at the junction of said first diode and first capacitor which corresponds in magnitude to the amount by which the peak collector voltage of said first amplifier transistor exceeds a selected voltage threshold level, said current level sensing means is an average collector current detector comprising a first resistor connected between said first source of supply voltage and the collector of said first amplifier transistor, a second amplifier including a transistor having collector, emitter and base electrode, a second resistor connected between the emitter of said second amplifier transistor and the junction of said first supply voltage source and said first resistor, a second diode connected between the junction of said first resistor and the collector of said first amplifier transistor and the base electrode of said second amplifier transistor, a third resistor connected between the base of said second transistor amplifier and said source of reference potential, a fourth resistor connected between the collector of said second transistor amplifier and said source of reference potential, a detector output terminal, and a third diode connected between the collector of said second transistor amplifier and said detector output terminal, said current detector being operative to generate a sensing signal at said detector output terminal which corresponds in magnitude to the amount by which the average collector current of said first amplifier transistor exceeds a selected current threshold level, said means for regulating the power output level of said drive power source comprises the inclusion in said drive power source of a third amplifier stage adapted to be controlled in gain by a direct current control voltage applied thereto, and said means for combining said voltage and current level sensings comprises a fourth amplifier including a transistor having a collector, emitter and base electrodes, means connecting the base of said fourth amplifier transistor to a source of direct current bias voltage, impedance means connected between the emitter of said fourth amplifier transistor and said source of reference potential, a fifth resistor connected between the collector of said fourth amplifier transistor and a second source of direct current supply voltage, a voltage sensing signal path connecting the junction of said first diode and first capacitor to the base of said fourth amplifier transistor, a current sensing signal path connecting said current detector output terminal to the emitter of said fourth amplifier transistor, and means including an automatic gain control signal path connecting the collector of said fourth amplifier transistor to said third amplifier, said voltage threshold level being established by the forward voltage drop of said first diode and said bias voltage, said current threshold level being established by the resistance values of said first, second and fourth resistors, the gain of said second amplifier, the forward voltage drop of said third diode and the voltage drop across said impedance means, and said fourth amplifier being operative in response to said second supply voltage, said bias voltage, and said voltage and current sensing signals to provide at its collector electrode a direct current control voltage for said drive power regulating means.

11. Automatic drive power control means in accordance with claim 1 wherein said first amplifier comprises first and second transistors each having collector, emitter and base electrodes connected as a push-pull power amplifier, said drive power source is coupled to the base electrodes of said first and second transistors, the collectors of said first and second transistors are transformer coupled to said load and connected to a source of direct current supply voltage, said voltage level sensing means is a peak collector voltage detector comprising first and second oppositely poled diodes serially connected across the collector electrodes of said first and second transistors and a first capacitor connected between the junction of said first and second diodes and a source of reference potential, said voltage detector being operative to generate a sensing signal at the junction of said first and second diodes which corresponds in magnitude to the amount by which the peak collector voltages of said first and second transistors exceed a selected voltage threshold level, and said current level sensing means is a peak emitter current detector comprising first and second resistors respectively connected between the emitter electrodes of said first and second transistors and said source of reference potential, third and fourth oppositely poled diodes serially connected ocross the emitters of said first and second transistors, and a second capacitor connected between the junction of said third and fourth diodes and said source of reference potential, said current detector being operative to generate a sensing signal at the junction of said third and fourth diodes which corresponds in magnitude to the amount by which the peak emitter currents of said first and second transistors exceed a selected current, threshold level, said voltage threshold level being established for the peak collector voltages of said first and second transistors by the respective forward voltage drops of said first and second diodes and a bias voltage applied to said first and second diodes, and said current threshold level being established for the peak emitter currents of said first and second transistors by the respective resistance values of said first and second resistors, the respective forward voltage drops of said third and fourth diodes, and a bias voltage applied to said third and fourth diodes.

References Cited

UNITED STATES PATENTS

| | | | |
|---|---|---|---|
| 2,245,353 | 6/1941 | Morlock | 330—134 |
| 3,036,276 | 5/1962 | Brown | 330—139 X |
| 3,102,241 | 8/1963 | Johnstone | 330—29 X |

ROY LAKE, *Primary Examiner.*

J. B. MULLINS, *Assistant Examiner.*

U.S. Cl. X.R.

325—151; 330—29, 139, 140